United States Patent [19]
Tomita et al.

[11] Patent Number: 5,457,661
[45] Date of Patent: Oct. 10, 1995

[54] SEMICONDUCTOR MEMORY DEVICE HAVING A DELAY CIRCUIT FOR CONTROLLING ACCESS TIME

[75] Inventors: Naoto Tomita, Yokohama; Imamiya Keniti, Kawasaki; Nobuaki Ohtsuka, Kawasaki; Junichi Miyamoto, Yokohama, all of Japan

[73] Assignee: Kabushiki Kaisha Toshiba, Kawasaki, Japan

[21] Appl. No.: 264,775

[22] Filed: Jun. 23, 1994

[30] Foreign Application Priority Data

Jun. 25, 1993 [JP] Japan .................................. 5-154690

[51] Int. Cl.$^6$ ...................................... G11C 8/00
[52] U.S. Cl. .................. 365/233.5; 365/230.06; 365/194
[58] Field of Search ........................ 365/233.5, 189.05, 365/230.06, 230.08, 194, 206

[56] References Cited

U.S. PATENT DOCUMENTS 4,707,809  11/1987  Ando ................................. 365/233.5
5,313,422   5/1994  Houston ........................... 365/189.08

FOREIGN PATENT DOCUMENTS 0314180  5/1989  European Pat. Off. .
0543269  5/1993  European Pat. Off. .

Primary Examiner—David C. Nelms
Assistant Examiner—A. Zarabian
Attorney, Agent, or Firm—Banner & Allegretti, Ltd.

[57] ABSTRACT

A semiconductor memory circuit includes a memory cell array having a plurality of memory cells. Column selection lines constitute connection lines extending from the memory cell array and are divided into hierarchies like a tree by selecting transistors. More specifically, a column selection system is hierarchically divided into column selection lines belonging to a first-stage column decoder and a second-stage column decoder. Row selection lines are controlled by a row decoder. The semiconductor memory circuit also includes an ATD circuit for detecting a transition of an address signal to generate a pulse, a pulse width control circuit for controlling the width of the pulse to determine data in a sense amplifier, and a latch circuit for latching readout data in response to the width of the pulse. A delay circuit is provided in the first-stage column decoder of an upper hierarchy to which a small number of selecting transistors belong and from which a signal rises at high speed. The delay circuit of the first-stage column decoder causes the pulse from the ATD circuit to always operate the latch circuit earlier than the timing of transition of data in the sense amplifier, thereby latching the preceding data.

61 Claims, 6 Drawing Sheets

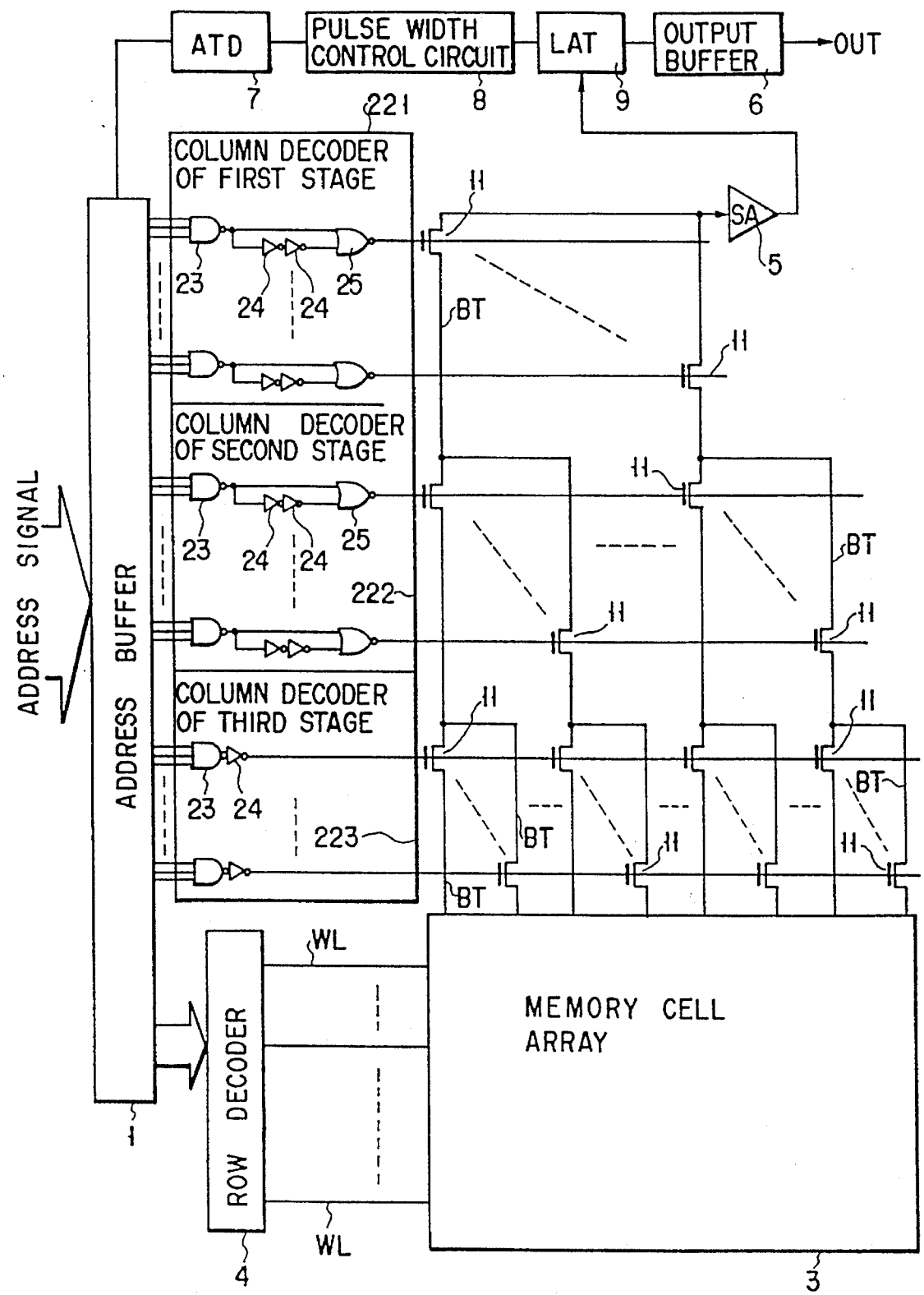
F I G. 4

SEMICONDUCTOR MEMORY DEVICE HAVING A DELAY CIRCUIT FOR CONTROLLING ACCESS TIME

BACKGROUND OF THE INVENTION

1. Field of the Invention

The present invention relates to a semiconductor memory circuit and, more specifically, to a semiconductor memory circuit having a function of latching data until its subsequent data is determined in a sense amplifier in order to stably read out the data.

2. Description of the Related Art

FIGS. 1A and 1B are circuit diagrams showing a readout system of a conventional nonvolatile memory. In the circuit of FIG. 1A, a bit line (column selection line) is selected as follows. Address signals are supplied from an address pin to a column decoder 21 of first stage and a column decoder 22 of second stage through an address buffer 1. In each of the column decoders 21 and 22, a NAND gate 23 and an inverter 24 are connected in series, as shown in FIG. 1B, and then connected to the gates of selecting transistors 11. The first-stage column decoder 21 outputs a first selection signal SS1 and the second-stage column decoder 22 outputs a second selection signal SS2 to turn on the selecting transistors 11(a) and 11(b), respectively. Thus, one bit line BT is selected from a memory cell array 3. In contrast, an address signal is supplied to a row selection circuit 4 through the address buffer 1, and one word line (row selection line) WL is selected from the memory cell array 3. Data of a memory cell at the crossing point of the selected bit and word lines is transmitted to a sense amplifier 5 via the selecting transistors 11(a) and 11(b). The sense amplifier 5 determines whether the data is "0" or "1", and outputs it via a buffer circuit 6.

While the sense amplifier 5 is sensing data, an unstable state influences the buffer circuit 6 or data to be output. More specifically, the following drawback arises. In the memory cell selection process, the currently-selected bit and word lines are not changed to new ones instantaneously, but there occurs a difference in time between the selection of the current bit and word lines and that of the new ones. Just then, data of a memory cell other than a desired memory cell is read. If the read data is determined as data opposite to desired data by the sense amplifier, it is reversed. Thus, a large-sized transistor in the buffer circuit 6 repeats turning on and turning off until the data is determined by the sense amplifier, which is likely to be a noise source of a power line. The noise source adversely affects access time.

To eliminate the above drawback, an ATD (address transition detector) circuit 7 for detecting a transition of an address signal and generating a pulse is employed to latch data until its subsequent data is determined by the sense amplifier and then output as readout data. More specifically, the ATD circuit 7 receives an address signal from the address buffer and generates a pulse. The pulse is controlled by a pulse width control circuit 8 so as to have a width required for determining data by the sense amplifier 5. A latch circuit 9 latches data to be read out in accordance with the width of the pulse. When an address signal is changed to a new one, the latch circuit 9 still latches old data, which is obtained before the address signal is changed, by the functions of the ATD circuit 7 and pulse width control circuit 8. When new data is determined by the sense amplifier 5, the pulse supplied to the latch circuit 9, and the latch circuit 9 transfers the new data to the buffer circuit 6 in response to the new address signal. The new data is then output as new readout data.

In the foregoing circuit arrangement, since both the buffer circuit 6 and readout data are stable even while the sense amplifier 5 is sensing its subsequent data, noise can be eliminated, with the result that an access operation can be performed at high speed.

If, however, data of the sense amplifier 5 is reversed before its preceding data is latched in response to the pulse generated from the ATD circuit 7, data opposite to the preceding data is latched, which causes noise. The pulse transmitted to the latch circuit 9 has an unignorable delay due to gate delays of the ATD circuit 7 and pulse width control circuit 8 or wiring delays caused by wiring resistance and wiring capacity. Therefore, the column decoders 21 and 22 are operated at high speed, and the bit lines (column selection lines) are switched quickly. If, in this case, data of a selected memory cell is opposite to its preceding data to be latched, the opposite data is input to the latch circuit 9 through the sense amplifier 5 before the pulse is input thereto. Thus, the opposite data is latched.

There may be a case where, when a row selection signal is switched very quickly and a row selection line is changed accordingly, data of a memory cell acquired by this change is opposite to its preceding data, and the reversed data of the sense amplifier rises earlier than the pulse from the ATD does. In a nonvolatile memory, generally, the word lines are connected to the gates of a plurality of memory cells and, even though a word line selection signal is changed very quickly, it takes time to increase the gate potential of the memory cells over the threshold value of the "1+ data cells so that data can be read out. Actually, in most cases, access time is controlled by the rise of word lines. Therefore, it is bit lines (column selection lines) that are switched quickly.

As has been known conventionally, in a nonvolatile memory, "1+ data is read out very quickly in the column direction. The reason is as follows. A nonselected bit line of about 0 V corresponds to the "1+ data due to discharge from the drain junction of memory cells. When "1+ data is read out through the bit line of 0 V, the sense amplifier is to read out the "1+ data simply because a bit line is switched. All signals supplied to address pins are likely to be changed, depending upon where a selected cell is located, and all address buffers are operated to cause a large current to flow in all the chips. If the large current flows, the potential at the power line is lowered instantaneously. If the control circuit 8 is weaker to noise than the sense amplifier 5, the rise of a pulse signal deteriorates and the timing at which data is latched is delayed. If, furthermore, the latch circuit 9 is located far away from the ATD circuit 7 for generating a pulse, the wiring resistance and wiring capacity are increased to an unignorable extent, with the result that the timing at which data is latched is delayed more and more.

When the foregoing drawbacks occur, "1+ data, which is read out quickly in a "1+ data read mode, is latched.

In short, the conventional memory device has the following drawback. When an address signal is changed to a new one, if data of the sense amplifier is reversed in response to the new address signal before the preceding data, which is obtained before the address signal is changed, is latched in response to a pulse generated from the ATD circuit, the reversed data is latched, which causes noise.

SUMMARY OF THE INVENTION

It is accordingly an object of the present invention to provide a semiconductor memory circuit which operates a sense amplifier in a read mode, latches data before its subsequent data is reversed, and exercises no adverse influence on access time, under any condition.

To attain the above object, there is provided a semiconductor memory circuit, comprising:

a memory cell array including a plurality of memory cells;

a plurality of column selection lines constituting connection lines extending in a column direction of the memory cell array and divided into predetermined hierarchies by providing selecting transistors;

a plurality of row selection lines constituting connection lines extending in a row direction of the memory cell array;

a sense amplifier for receiving data from the memory cells through the column selection lines and determining the data;

an address buffer circuit for converting an externally input address signal to an internal signal;

data holding means for detecting a transition of the internal signal supplied from the address buffer circuit to generate a pulse signal, and preventing data of the memory cell from changing in response to the pulse signal in order to hold readout data precedent to the data for a period of time from when the address signal is converted to the internal signal until when the data of the memory cell is determined by the sense amplifier;

a row decoder for selecting the row selection lines in response to the internal signal supplied from the address buffer circuit;

a column decoder arranged for each of the predetermined hierarchies, for selecting the column selection lines through the selecting transistors in response to the internal signal supplied from the address buffer circuit; and delay means provided in the column decoder, for decreasing a selection speed of the selecting transistors belonging to at least an upper one of the predetermined hierarchies.

According to the circuit arrangement described above, the delay means delays a signal supplied from a column decoder of the upper hierarchy, which causes data of a memory cell to be output earlier than a pulse signal supplied to the data holding means, and the timing at which the column selection line connected to the sense amplifier is changed, is delayed. Therefore, a period of time during which the sense amplifier is sensing data, is lengthened and, during this period, the latch circuit is operated to latch the preceding data. Furthermore, the rise of the signal delayed by the delay means is not later than that of a signal output from the column decoder of the lower hierarchy, which controls access speed. The access speed is not therefore decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a circuit diagram showing an arrangement of a readout system of a nonvolatile semiconductor memory circuit according to a second embodiment of the present invention;

DESCRIPTION OF THE PREFERRED EMBODIMENTS

Figure 1A:
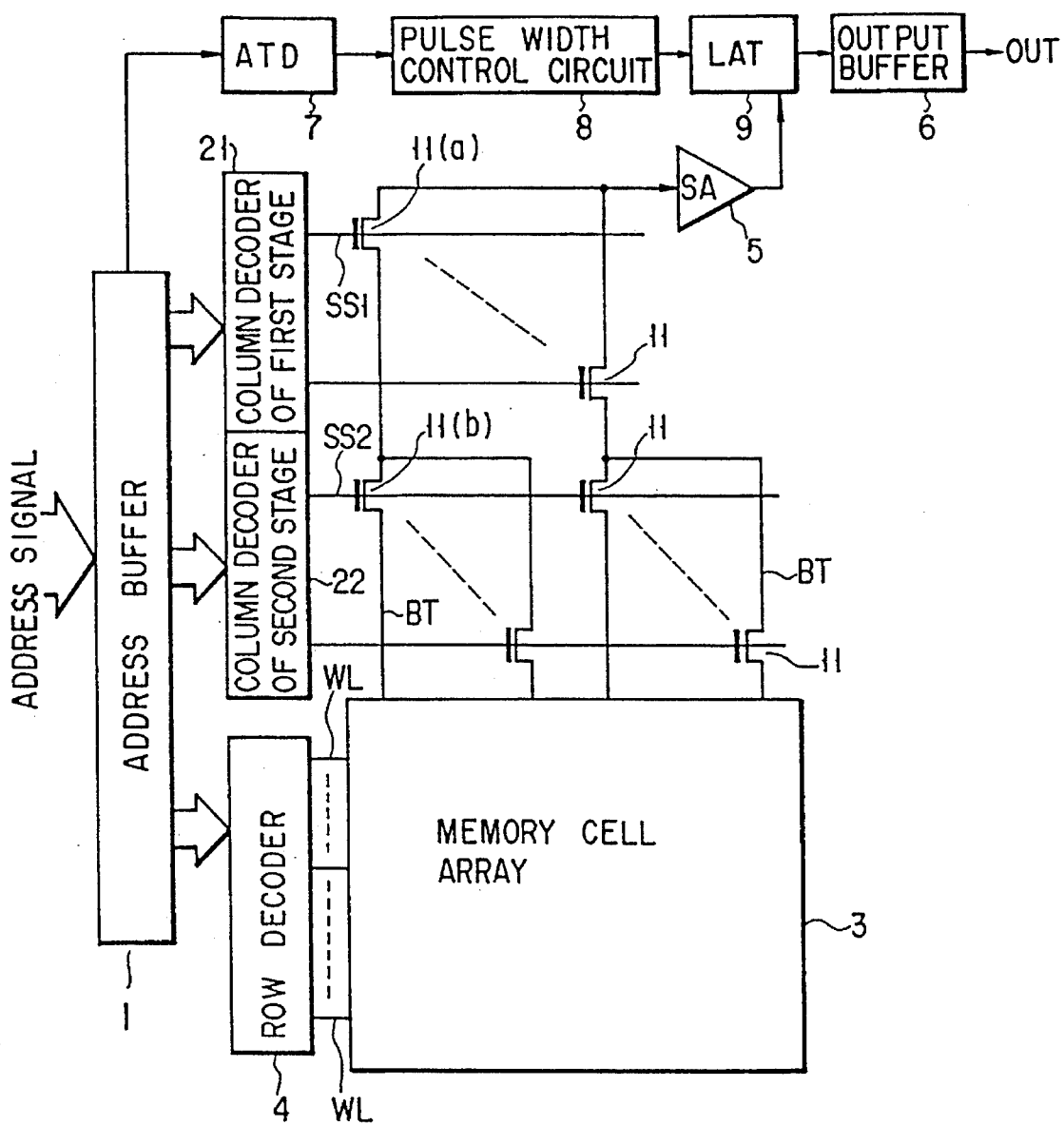
FIG. 1A is a circuit diagram of a readout system of a conventional nonvolatile memory circuit.
Figure 1B:
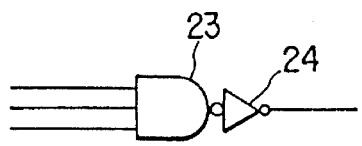
FIG. 1B is a circuit diagram of part of the readout system shown in FIG. 1A.
Figure 2:
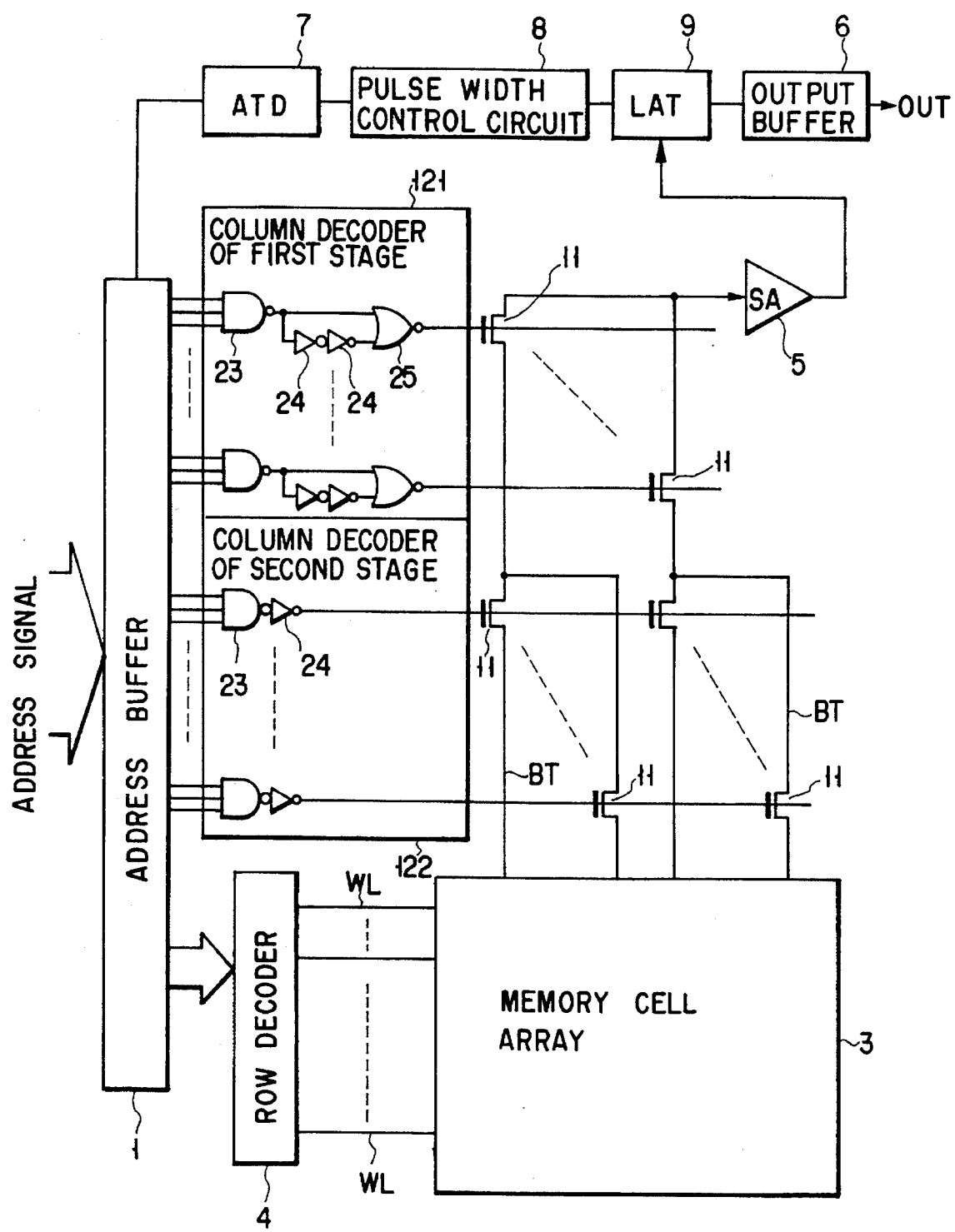
FIG. 2 is a circuit diagram showing an arrangement of a readout system of a nonvolatile semiconductor memory circuit according to a first embodiment of the present invention.

FIG. 2 is a circuit diagram showing an arrangement of a readout system of a nonvolatile semiconductor memory according to a first embodiment of the present invention. In FIG. 2, the same components as those in FIG. 1 are denoted by the same reference numerals. A plurality of memory cells (not shown) are arranged in a matrix in a memory cell array 3. The respective column selection lines (bit lines) BT of the memory cell array 3 hierarchically extend through selecting transistors 11 to be structured as a tree. The column decoder is hierarchically divided into a column decoder 121 of first stage and a column decoder 122 of second stage. The row selection lines (word lines) WL of the memory cell array 3 are controlled by a row decoder 4.

The readout system includes an ATD circuit 7 for generating a pulse by detecting a transition of an address signal, a pulse width control circuit 8 for controlling the pulse generated from the ATD circuit 7 so as to have a width necessary for determining data in a sense amplifier 5, a latch circuit 9 for latching the data in accordance with the pulse width obtained from the pulse width control circuit 8, and an output buffer 6 for receiving the data from the latch circuit 9 and outputting it as readout data.

In the first-stage column decoder 121 of the upper hierarchy, the number of selecting transistors 11 is small, and a signal rises at very high speed. In the second-stage column decoder 122 of the lower hierarchy, the number of selecting transistors 11 is large. In the first embodiment, therefore, the first-stage column decoder 121 is provided with a signal delay means so that the bit line selection speed of the column decoder 121 becomes close to that of the column decoder 122. In other words, the transmission of signals to the selecting transistors is controlled by actively arranging a signal delay means in the first-stage column decoder 121. In general, a delay circuit is added to a column decoder from which a signal is transmitted to a column selection line (bit line) at higher speed than the normal speed in order to make the speed coincident with a speed for determining a decode signal of another column decoder from which a signal is transmitted to a column selection line at the normal speed. Access time is determined based on the normal speed.

While the second-stage column decoder 122 has the same structure as that of the column decoder shown in FIG. 1B, the first-stage column decoder 121 includes a NAND gate 23, a NOR gate 25, and two inverters 24 connected in series between the gates 23 and 25. The NOR gate 25 receives both an output signal of the NAND gate 23 and a signal generated by delaying the output signal of the gate 23 by the two inverters 24.

In the foregoing circuit arrangement of the readout system, since a selection signal supplied to the column selection line causes data of a memory cell to be output earlier than a pulse signal generated from the ATD circuit 7, the selection signal is delayed by the inverters 24 constituting a delay circuit and accordingly the timing of transition between the column selection lines connected to the sense amplifier 5 is delayed. Therefore, a period of time during which the sense amplifier 5 is sensing the data is lengthened and, during this period, the latch circuit 9 is operated to latch the preceding data.

It is because a selection signal supplied from the upper hierarchy, that is, a decode signal supplied from the first-stage column decoder 121 that data of a memory cell is output earlier than a pulse signal is transmitted from the ATD circuit 7 to the latch circuit 9. Therefore, the delay circuit is added to the first-stage column decoder 121. Access time is not lengthened unless the rise of the selection signal delayed by the delay circuit is later than determination of a selection signal supplied from the lower hierarchy which controls the access time, that is, determination of a decode signal supplied from the second-stage column decoder 122.

Figure 3:
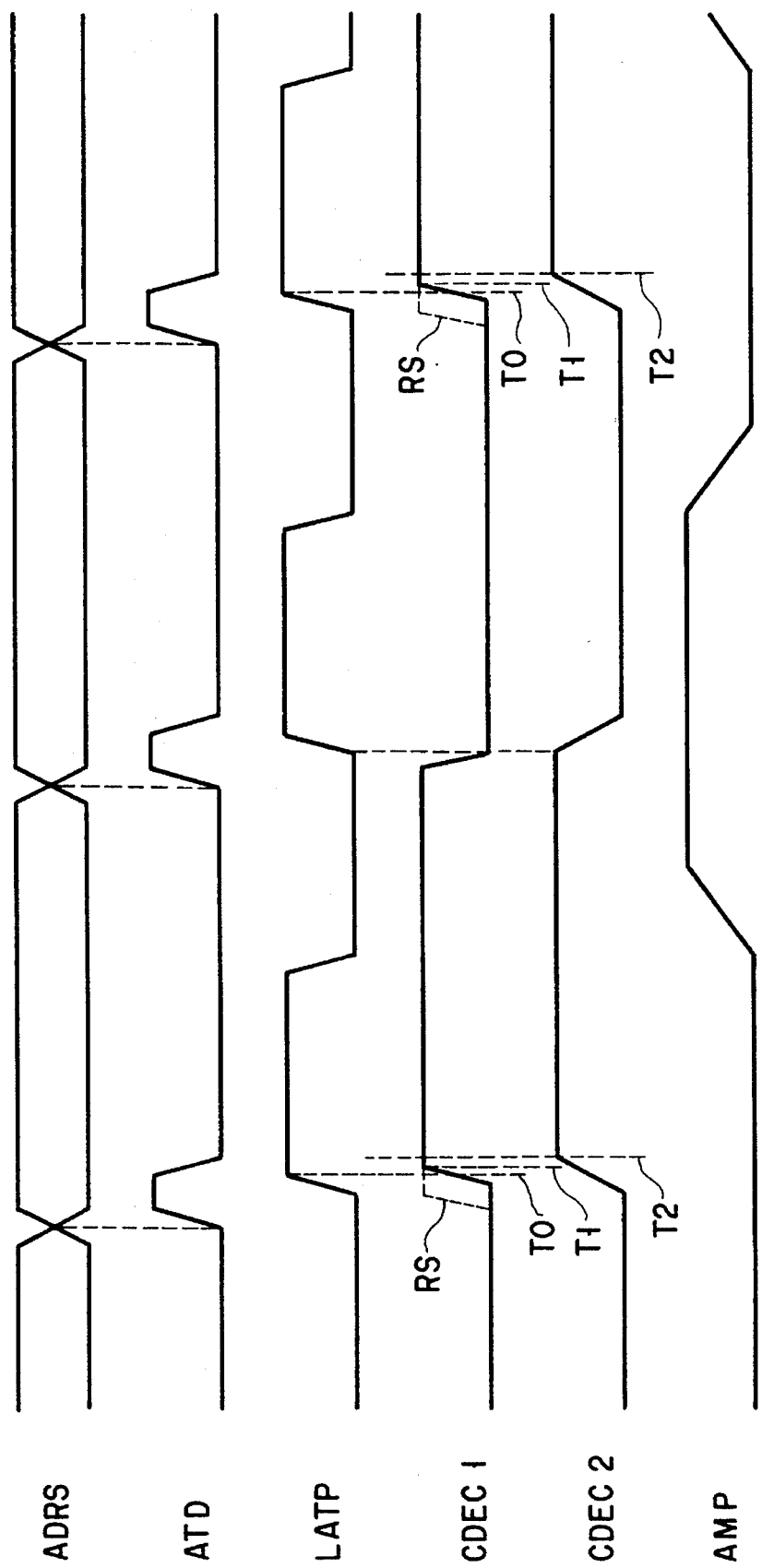
FIG. 3 is a timing chart of respective components, showing an operation of the memory circuit of FIG. 2.

FIG. 3 is a timing chart of the respective components showing an operation of the readout system of FIG. 2. In response to a signal ATD of the ATD circuit 7 for detecting the transition of address signal ADRS, the pulse width control circuit 8 outputs a latch pulse signal LATP. The latch circuit 9 receives a data signal AMP from the sense amplifier 5 in response to the signal LATP. A decode signal CDEC1 of the first-stage column decoder 121 and a decode signal CDEC2 of the second-stage column decoder 122 are supplied to the gates of their corresponding selecting transistors 11. Since the number of selecting transistors 11 for the column decoder 122 is larger than that of selecting transistors 11 for the column decoder 121, the rising speed of the decode signal CDEC2 is lower than that of the decode signal CDEC1 in view of CR time constant. If the column decoder 121 does not include the inverters 24 of the delay circuit, the rise of the decode signal CDEC1 is completed before the latch pulse signal LATP rises, as indicated by dotted line RS in FIG. 3, and it is likely that undetermined data will be supplied to the sense amplifier 5 and then latched by the latch circuit 9. The circuit of the present invention is so improved that the inverters 24 cause the decode signal CDEC1 to be always determined after time T0 when the rise of the latch pulse signal LATP is completed. Furthermore, the rise of the decode signal CDEC1 is completed before the rise of the selection signal supplied from the column decoder 122 of the lower hierarchy, which controls access time, is completed, that is, before time T2 when the decode signal CDEC2 is determined, and the decode signal CDEC1 is thus determined at time T1. Therefore, access time is not influenced at all.

According to the above circuit arrangement, the inverters 24 are capable of delaying the rise timing of an output signal of the first-stage column decoder 121, and the NOR gate 25 allows access time to be equal to that of the circuit shown in FIG. 1, without delaying the fall timing of the output signal of the column decoder 121. Consequently, a problem of noise, which causes access time to be lengthened, can be eliminated.

In the first embodiment described above, two column decoders are formed. However, three or more column decoders can be formed and, in this case, too, the column decoders excluding the column decoder of the lowermost hierarchy can be provided with delay circuits in order to make their bit line selection timings close to that of the column decoder of the lowermost hierarchy which controls access time.

FIG. 4 is a circuit diagram showing an arrangement of a readout system of a nonvolatile semiconductor memory circuit according to a second embodiment of the present invention. In FIG. 4, the same components as those in FIG. 2 are denoted by the same reference numerals. The respective column selection lines (bit lines) BT of the memory cell array 3 extend through selecting transistors 11 and are structured as a tree of three hierarchies, and a column decoder is divided into three column decoders—a column decoder 221 of first stage, a column decoder 222 of second stage, and a column decoder 223 of third stage—corresponding to the three hierarchies. In FIG. 4, for example, the number of bit lines belonging to the first-stage column decoder 221 is 8, the number of bit lines belonging to the second-stage column decoder 222 is 64 because 8 bit lines are connected to each of 8 bit lines of the column decoder 221, and the number of bit lines belonging to the third-stage column decoder 223 is 512 because 8 bit lines are connected to each of 64 bit lines of the column decoder 222.

In the second embodiment, the number of selecting transistors 11 of each of the first- and second-stage column decoders 221 and 222 is smaller than that of selecting transistors 11 of the third-stage column decoder 223, and the rising speed of a signal output from each of the column decoders 221 and 222 is higher than that of a signal output from the column decoder 223. Therefore, the first- and second-stage column decoders 221 and 222 are provided with signal delay circuits in order to make the bit line selection speed of each of the column decoders 221 and 222 close to that of the column decoder 223.

While the arrangement of the third-stage column decoder 223 is the same as that of the column decoder shown in FIG. 1B, each of the first- and second-stage column decoders 221 and 222 includes a NAND gate 23, a NOR gate 25, and inverters 24 connected in series between the gates 23 and 25. The NOR gate 25 receives both an output signal of the NAND gate 23 and a signal generated by delaying the output signal of the gate 23 by the inverters 24. The circuit arrangement of the second embodiment is capable of resolving a problem of noise, without having any influence on access time, as that of the first embodiment shown in FIG. 2.

Figure 5:
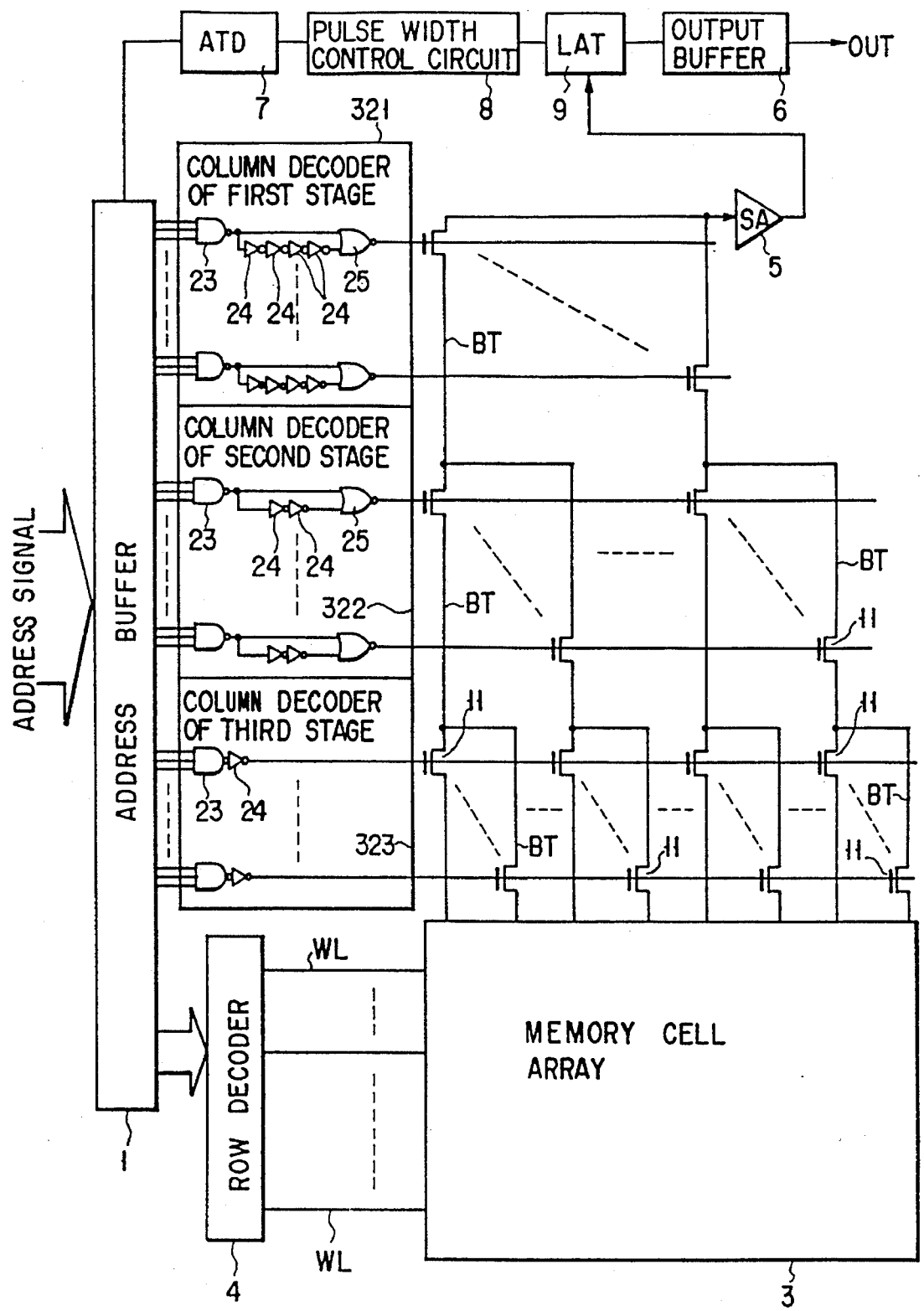
FIG. 5 is a circuit diagram showing an arrangement of a readout system of a nonvolatile semiconductor memory circuit according to a third embodiment of the present invention.

FIG. 5 is a circuit diagram showing an arrangement of a readout system of a nonvolatile semiconductor memory circuit according to a third embodiment of the present invention. In FIG. 5, the same components as those in FIG. 4 are denoted by the same reference numerals. The structure of FIG. 5 differs from that of FIG. 4 in a delay circuit of a column decoder 321 of first stage. More specifically, the column decoder 321 includes a NAND gate 23, a NOR gate 25, and four inverters 24 connected in series between the gates 23 and 25, and the NOR gate 25 receives both an output signal of the NAND gate 23 and a signal generated by delaying the output signal of the gate 23 by the four inverters 24.

As in the second embodiment shown in FIG. 4, the first- and second-stage column decoders 321 and 322 include inverters 24 serving as a signal delay circuit in order to make their bit line selection timings close to that of the third-stage column decoder 323. In the third embodiment, however, the inverters are arranged so as to reflect the number of selecting transistors 11 more strictly. According to the arrangement of the third embodiment, it is possible that the bit line selection speed of the first-stage column decoder 321 is lower than that of the second-stage column decoder 322. Needless to say, the bit line selection speed of the first-stage column decoder 321 has to be higher than that of the third-stage column decoder 323 which controls access time, so as not to exercise any influence on the access time. In the third embodiment, too, a problem of noise can be eliminated without any influence on access time.

Figure 6:
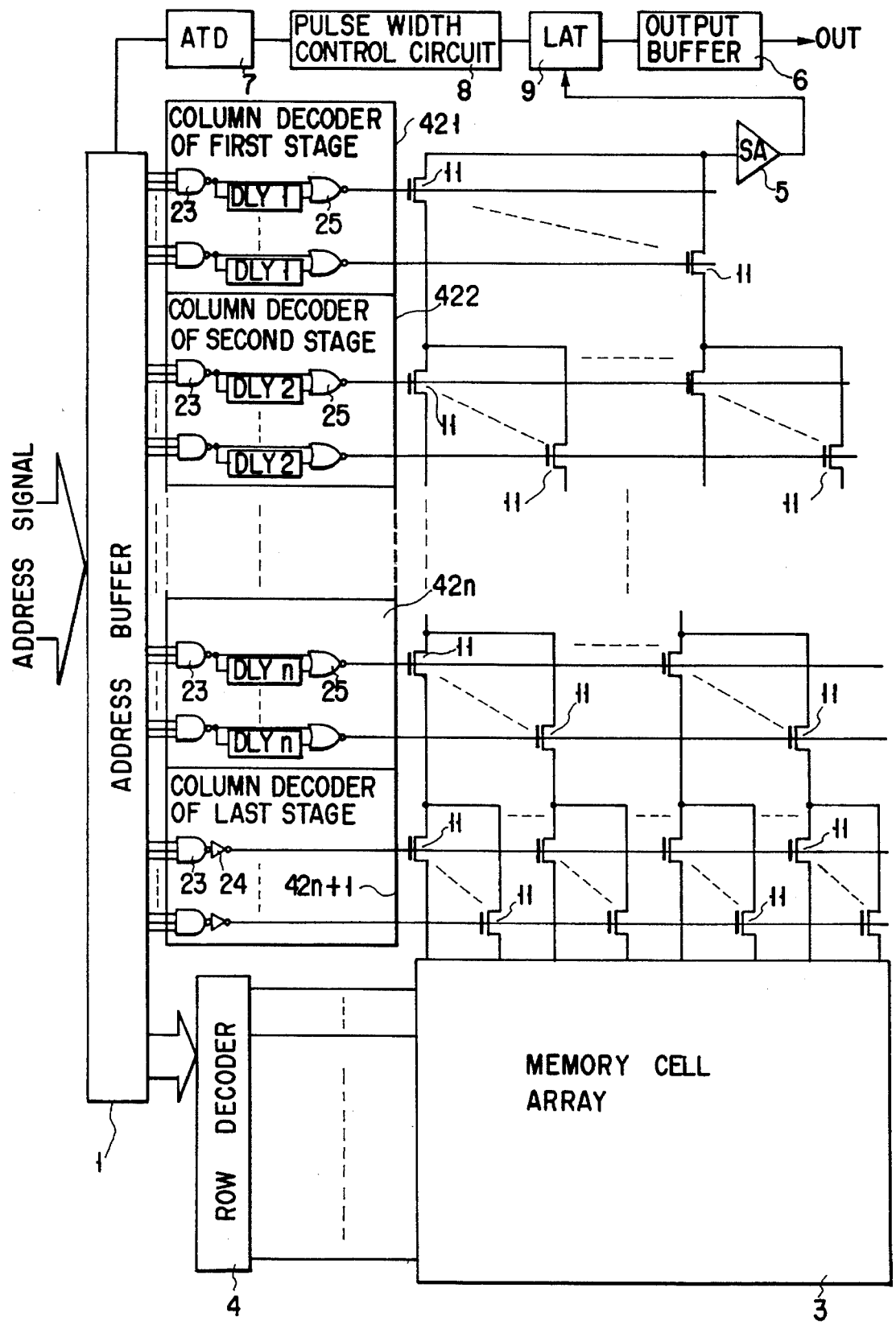
FIG. 6 is a circuit diagram showing an arrangement of a readout system of a nonvolatile semiconductor memory circuit according to a fourth embodiment of the present invention.

FIG. 6 is a circuit diagram showing an arrangement of a readout system of a nonvolatile semiconductor memory circuit according to a fourth embodiment of the present invention. Taking into consideration the circuit arrangement of FIG. 5, in the fourth embodiment, a plurality of column decoders 42n, 42n+1 (n=1, 2, 3, . . . ) corresponding to a plurality of hierarchies, can be constituted in accordance with selecting transistors 11 which are structured as a tree of the hierarchies. In order to reflect the number of selecting transistors 11 for each of the hierarchies, delay circuits DL1 to DLn are arranged in the column decoders 421 to 42n, respectively. Of course, the bit line selection timing of the first-stage column decoder 421 has to be earlier than that of the column decoder 42n+1 of the lowest hierarchy to exercise no influence on access time.

As described above, according to the present invention, the delay circuit of the column decoder of the upper hierarchy causes a signal from the ATD circuit to always operate the latch circuit earlier than the timing of transition of data in the sense amplifier, thereby to latch the preceding data before the data of the sense amplifier is reversed. Since, furthermore, the rise of a signal delayed by the delay circuit is not later than that of a signal output from the column decoder of the lower hierarchy, which controls access speed, the access speed is not decreased. Consequently, the semiconductor memory circuit of the present invention is capable of eliminating a problem of noise which causes the access speed to decrease.

An EPROM, a NOR flash memory, an MROM, or the like can be applied to the memory circuit of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory circuit comprising:

a memory cell array including a plurality of memory cells arranged in rows and columns;

a plurality of column selection lines constituting connection lines extending in a column direction of said memory cell array and divided into predetermined hierarchies by providing selecting transistors;

a plurality of row selection lines constituting connection lines extending in a row direction of said memory cell array;

a sense amplifier for receiving data from the memory cells through said column selection lines and sensing and amplifying the data;

an address buffer circuit for converting an externally input address signal to an internal address signal;

data output means comprising:

means for detecting a transition of the internal address signal supplied from said address buffer circuit and generating a pulse signal, a latch circuit for receiving and holding data received from said sense amplifier, and means for preventing said latch circuit from outputting the data of a first memory cell received from said sense amplifier in response to the pulse signal for a period of time from when the externally input address signal is converted to the internal address signal until when new data of a second memory cell is sensed and amplified by said sense amplifier;

a row decoder for selecting said row selection lines in response to the internal address signal supplied from said address buffer circuit;

a column decoder arranged for each of the predetermined hierarchies, for selecting said column selection lines through said selecting transistors in response to the internal address signal supplied from said address buffer circuit; and delay means provided in a column decoder arranged for at least an upper one of the predetermined hierarchies, for decreasing a selection speed of said selecting transistors belonging to said at least an upper one of the predetermined hierarchies so as to approach a selection speed of said selecting transistors belonging to at least a lower one of the predetermined hierarchies.

2. The semiconductor memory circuit according to claim 1, wherein said delay means makes a timing at which new data received by said sense amplifier reaches said latch circuit later than a timing at which the pulse signal reaches said latch circuit.

3. The semiconductor memory circuit according to claim 1, wherein said delay means divides an internal decode output of said column decoder into two signals, one of the two signals being directly supplied to a logic circuit, and another signal being delayed by a delay circuit arranged in said delay means and then supplied to the logic circuit, said logic circuit having a logic output which is the same as the internal decode output of said column decoder.

4. The semiconductor memory circuit according to claim 3, wherein delay time of a delay circuit of a column decoder arranged for the upper hierarchy is longer than delay time of a delay circuit of said column decoder arranged for a lower one of said predetermined hierarchies, and delay time of a delay circuit of said column decoder arranged for an uppermost one of said at least an upper one of the predetermined hierarchies is set in such a manner that a timing of a selecting transistor selected by the internal decode output of said column decoder arranged for the uppermost hierarchy is earlier than a timing of a selecting transistor selected by the internal decode output of said column decoder arranged for a lowermost hierarchy.

5. The semiconductor memory circuit according to claim 4, wherein delay times of delay circuits arranged in said column decoders arranged for adjacent hierarchies in the row direction are set equal to each other.

6. A semiconductor memory circuit comprising:

a memory cell array including a plurality of memory cells arranged in rows and columns;

a plurality of column selection lines constituting connection lines extending in a column direction of said memory cell array and divided into predetermined hierarchies by providing selecting transistors;

a plurality of row selection lines constituting connection lines extending in a row direction of said memory cell array;

a sense amplifier for receiving data from the memory cells through said column selection lines and sensing and amplifying the data;

an address buffer circuit for convening an externally input address signal to an internal address signal;

data output means comprising:

means for detecting a transition of the internal address signal supplied from said address buffer circuit and generating a pulse signal, a latch circuit for receiving and holding data received from said sense amplifier, and means for preventing said latch circuit from outputting the data of a first memory cell received from said sense amplifier in response to the pulse signal for a period of time from when the externally input address signal is converted to the internal address signal until when new data of a second memory cell is sensed and amplified by said sense amplifier;

a row decoder for selecting said row selection lines in response to the internal address signal supplied from said address buffer circuit;

a column decoder arranged for each of the predetermined hierarchies, for selecting said column selection lines through said selecting transistors in response to the internal address signal supplied from said address buffer circuit; and delay means added to said column decoder from which a signal is transmitted to said column selection lines at a timing earlier than a normal timing, for changing the timing so as to coincide with the normal timing wherein said delay means makes a timing at which the new data received by said sense amplifier reaches said latch circuit later than a timing at which the pulse signal reaches said latch circuit.

7. The semiconductor memory circuit according to claim 6, wherein said delay means divides an internal decode output of said column decoder into two signals, one of the two signals being directly supplied to a logic circuit, and another signal being delayed by a delay circuit arranged in said delay means and then supplied to the logic circuit, said logic circuit having a logic output which is the same as the internal decode output of said column decoder.

8. The semiconductor memory circuit according to claim 7, wherein delay time of a delay circuit of a column decoder arranged for the upper hierarchy is longer than delay time of a delay circuit of said column decoder arranged for a lower one of said predetermined hierarchies, and delay time of a delay circuit of said column decoder arranged for an uppermost one of said at least an upper one of the predetermined hierarchies is set in such a manner that a timing of a selecting transistor selected by the internal decode output of said column decoder arranged for the uppermost hierarchy is earlier than a timing of a selecting transistor selected by the internal decode output of said column decoder arranged for a lowermost hierarchy.

9. The semiconductor memory circuit according claim 8, wherein delay times of delay circuits arranged in said column decoders arranged for adjacent hierarchies in the row direction are set equal to each other.

10. A semiconductor memory circuit comprising:

a memory cell array including a plurality of memory cells arranged in rows and columns;

a plurality of column selection lines constituting connection lines extending in a column direction of said memory cell array and divided into predetermined hierarchies by providing selecting transistors;

a plurality of row selection lines constituting connection lines extending in a row direction of said memory cell array;

a sense amplifier for receiving data from the memory cells through said column selection lines and sensing and amplifying the data;

an address buffer circuit for converting an externally input address signal to an internal address signal;

data output means comprising:

means for detecting a transition of the internal address signal supplied from said address buffer circuit and generating a pulse signal, a latch circuit for receiving and holding data received from said sense amplifier, and means for preventing said latch circuit from outputting the data of a first memory cell received from said sense amplifier in response to the pulse signal for a period of time from when the externally input address signal is converted to the internal address signal until when new data of a second memory cell is sensed and amplified by said sense amplifier;

a row decoder for selecting said row selection lines in response to the internal address signal supplied from said address buffer circuit;

a column decoder arranged for each of the predetermined hierarchies, for selecting said column selection lines through said selecting transistors in response to the internal address signal supplied from said address buffer circuit; and delay means added to a column decoder of an upper hierarchy which belongs to a small number of the selecting transistors and transmits a signal to said column selection lines at a very high speed, for decreasing the speed of the signal so as to approach a speed of a signal transmitted to said column selection lines from a column decoder of a lower hierarchy belonging to a large number of the selecting transistors.

11. The semiconductor memory circuit according to claim 10, wherein said delay means makes a timing at which new data received by said sense amplifier reaches said latch circuit later than a timing at which the pulse signal reaches said latch circuit.

12. The semiconductor memory circuit according to claim 10, wherein said delay means divides an internal decode output of said column decoder into two signals, one of the two signals being directly supplied to a logic circuit, and another signal being delayed by a delay circuit arranged in said delay means and then supplied to the logic circuit, said logic circuit having a logic output which is the same as the internal decode output of said column decoder.

13. The semiconductor memory circuit according claim 12, wherein delay times of delay circuits arranged in said column decoders arranged for adjacent hierarchies in the row direction are set equal to each other.

14. A semiconductor memory circuit comprising:

a memory cell array including a plurality of memory cells arranged in rows and columns;

a plurality of column selection lines constituting connection lines extending in a column direction of said memory cell array and divided into predetermined hierarchies by providing selecting transistors;

a plurality of row selection lines constituting connection lines extending in a row direction of said memory cell array;

a sense amplifier for receiving data from the memory cells through said column selection lines and sensing and amplifying the data;

an address buffer circuit for converting an externally input address signal to an internal address signal;

data output means comprising:

means for detecting a transition of the internal address signal supplied from said address buffer circuit and generating a pulse signal, a latch circuit for receiving and holding data received from said sense amplifier, and means for preventing said latch circuit from outputting the data of a first memory cell received from said sense amplifier in response to the pulse signal for a period of time from when the externally input address signal is converted to the internal address signal until when new data of a second memory cell is sensed and amplified by said sense amplifier;

a row decoder for selecting said row selection lines in response to the internal address signal supplied from said address buffer circuit;

a column decoder arranged for each of the predetermined hierarchies, for selecting said column selection lines through said selecting transistors in response to the internal address signal supplied from said address buffer circuit; and delay means arranged in said column decoder, for actively causing a difference in output timing between said column decoders of the predetermined hierarchies, wherein said delay means makes a timing at which the new data received by said sense amplifier reaches said latch circuit later than a timing at which the pulse signal reaches said latch circuit.

15. The semiconductor memory circuit according to claim 14, wherein said delay means divides an internal decode output of said column decoder into two signals, one of the two signals being directly supplied to a logic circuit, and another signal being delayed by a delay circuit arranged in said delay means and then supplied to the logic circuit, said logic circuit having a logic output which is the same as the internal decode output of said column decoder.

16. The semiconductor memory circuit according to claim 15, wherein delay time of a delay circuit of a column decoder arranged for the upper hierarchy is longer than delay time of a delay circuit of said column decoder arranged for a lower one of said predetermined hierarchies, and delay time of a delay circuit of said column decoder arranged for an uppermost one of said at least an upper one of the predetermined hierarchies is set in such a manner that a timing of a selecting transistor selected by the internal decode output of said column decoder arranged for the uppermost hierarchy is earlier than a timing of a selecting transistor selected by the internal decode output of said column decoder arranged for a lowermost hierarchy.

17. The semiconductor memory circuit according claim 16, wherein delay times of delay circuits arranged in said column decoders arranged for adjacent hierarchies in the row direction are set equal to each other.

18. A semiconductor memory circuit comprising:

a memory cell array including a plurality of memory cells arranged in rows and columns;

a plurality of column selection lines constituting connection lines extending in a column direction of said memory cell array and divided into a first hierarchy and a second hierarchy;

selecting transistors provided on said column selection lines, said selecting transistors being arranged based on said first hierarchy and said second hierarchy;

a plurality of row selection lines constituting connection lines extending in a row direction of said memory cell array;

a sense amplifier for receiving data from the memory cells through said column selection lines and sensing and amplifying the data;

an address buffer circuit for converting an externally input address signal to an internal address signal;

data output means comprising:

means for detecting a transition of the internal address signal supplied from said address buffer circuit and generating a pulse signal, a latch circuit for receiving and holding data received from said sense amplifier, and means for preventing said latch circuit from outputting the data of a first memory cell received from said sense amplifier in response to the pulse signal for a period of time from when the externally input address signal is converted to the internal address signal until when new data of a second memory cell is sensed and amplified by said sense amplifier;

a row decoder for selecting said row selection lines in response to the internal signal supplied from said address buffer circuit;

a first column decoder arranged for the first hierarchy and a second column decoder arranged for the second hierarchy, for selecting said column selection lines through said selecting transistors in response to the internal address signal supplied from said address buffer circuit; and delay means provided in said first column decoder, for decreasing a selection speed of said selecting transistors so as to be close to a selection speed of said selecting transistors belonging to said second column decode.

19. The semiconductor memory circuit according to claim 18, wherein said delay means makes a timing at which new data received by said sense amplifier reaches said latch circuit later than a timing at which the pulse signal reaches said latch circuit.

20. The semiconductor memory circuit according to claim 18, wherein said delay means divides an internal decode output of said first column decoder into two signals, one of the two signals being directly supplied to a logic circuit, and another signal being delayed by a delay circuit arranged in said delay means and then supplied to the logic circuit, said logic circuit having a logic output which is the same as the internal decode output of said first column decoder.

21. The semiconductor memory circuit according to claim 20, wherein delay time of said delay circuit of said first column decoder is set in such a manner that a timing of a selecting transistor selected by the internal decode output of said first column decoder is earlier than a timing of a selecting transistor selected by an internal decode output of said second column decoder.

22. A semiconductor memory circuit comprising:

a memory cell array including a plurality of memory cells arranged in rows and columns;

a plurality of column selection lines constituting connection lines extending in a column direction of said memory cell array and divided into a first hierarchy and a second hierarchy;

selecting transistors provided on said column selection lines, said selecting transistors being arranged based on said first hierarchy and said second hierarchy;

a plurality of row selection lines constituting connection lines extending in a row direction of said memory cell array;

a sense amplifier for receiving data from the memory cells through said column selection lines and sensing and amplifying the data;

an address buffer circuit for convening an externally input address signal to an internal address signal;

data output means comprising:

means for detecting a transition of the internal address signal supplied from said address buffer circuit and generating a pulse signal, a latch circuit for receiving and holding data received from said sense amplifier, and means for preventing said latch circuit from outputting the data of a first memory cell received from said sense amplifier in response to the pulse signal for a period of time from when the externally input address signal is converted to the internal address signal until when new data of a second memory cell is sensed and amplified by said sense amplifier;

a row decoder for selecting said row selection lines in response to the internal address signal supplied from said address buffer circuit;

a first column decoder arranged for the first hierarchy and a second column decoder arranged for the second hierarchy, for selecting said column selection lines through said selecting transistors in response to the internal address signal supplied from said address buffer circuit; and delay means added to said first column decoder from which a signal is transmitted to said column selection lines at a timing earlier than a normal timing, for changing the timing so as to coincide with the normal timing;

wherein said delay means makes a timing at which the new data received by said sense amplifier reaches said latch circuit later than a timing at which the pulse signal reaches said latch circuit.

23. The semiconductor memory circuit according to claim 22, wherein said delay means divides an internal decode output of said first column decoder into two signals, one of the two signals being directly supplied to a logic circuit, and another signal being delayed by a delay circuit arranged in said delay means and then supplied to the logic circuit, said logic circuit having a logic output which is the same as the internal decode output of said first column decoder.

24. The semiconductor memory circuit according to claim 23, wherein delay time of said delay circuit of said first column decoder is set in such a manner that a timing of a selecting transistor selected by the internal decode output of said first column decoder is earlier than a timing of a selecting transistor selected by an internal decode output of said second column decoder.

25. A semiconductor memory circuit comprising:

a memory cell array including a plurality of memory cells arranged in rows and columns;

a plurality of column selection lines constituting connection lines extending in a column direction of said memory cell array and divided into a first hierarchy and a second hierarchy;

selecting transistors provided on said column selection lines, said selecting transistors being arranged based on said first hierarchy and said second hierarchy;

a plurality of row selection lines constituting connection lines extending in a row direction of said memory cell array;

a sense amplifier for receiving data from the memory cells through said column selection lines and sensing and amplifying the data;

an address buffer circuit for converting an externally input address signal to an internal address signal;

data output means comprising:

means for detecting a transition of the internal address signal supplied from said address buffer circuit and generating a pulse signal, a latch circuit for receiving and holding data received from said sense amplifier, and means for preventing said latch circuit from outputting the data of a first memory cell received from said sense amplifier in response to the pulse signal for a period of time from when the externally input address signal is converted to the internal address signal until when new data of a second memory cell is sensed and amplified by said sense amplifier;

a row decoder for selecting said row selection lines in response to the internal address signal supplied from said address buffer circuit;

a first column decoder arranged for the first hierarchy and a second column decoder arranged for the second hierarchy, for selecting said column selection lines through said selecting transistors in response to the internal address signal supplied from said address buffer circuit; and delay means added to said first column decoder which belongs to a small number of the selecting transistors and transmits a signal to said column selection lines at a very high speed, for decreasing the speed of the signal so as to approach a speed of a signal transmitted to said column selection lines from said second column decoder belonging to a large number of the selecting transistors.

26. The semiconductor memory circuit according to claim 25, wherein said delay means makes a timing at which new data received by said sense amplifier reaches said latch circuit later than a timing at which the pulse signal reaches said latch circuit.

27. The semiconductor memory circuit according to claim 25, wherein said delay means divides an internal decode output of said column decoder into two signals, one of the two signals being directly supplied to a logic circuit, and another signal being delayed by a delay circuit arranged in said delay means and then supplied to the logic circuit, said logic circuit having a logic output which is the same as the internal decode output of said first column decoder.

28. A semiconductor memory circuit comprising:

a memory cell array including a plurality of memory cells arranged in rows and columns;

a plurality of column selection lines constituting connection lines extending in a column direction of said memory cell array and divided into a first hierarchy and a second hierarchy;

selecting transistors provided on said column selection lines, said selecting transistors being arranged based on said first hierarchy and said second hierarchy; a plurality of row selection lines constituting connection lines extending in a row direction of said memory cell array;

a sense amplifier for receiving data from the memory cells through said column selection lines and sensing and amplifying the data;

an address buffer circuit for converting an externally input address signal to an internal address signal;

data output means comprising:

means for detecting a transition of the internal address signal supplied from said address buffer circuit and generating a pulse signal, a latch circuit for receiving and holding data received from said sense amplifier, and means for preventing said latch circuit from outputting the data of a first memory cell received from said sense amplifier in response to the pulse signal for a period of time from when the externally input address signal is converted to the internal address signal until when new data of a second memory cell is sensed and amplified by said sense amplifier;

a row decoder for selecting said row selection lines in response to the internal address signal supplied from said address buffer circuit;

a first column decoder arranged for the first hierarchy and a second column decoder arranged for the second hierarchy, for selecting said column selection lines through said selecting transistors in response to the internal address signal supplied from said address buffer circuit; and delay means arranged in said first column decoder, for actively causing a difference in output timing between said first and second column decoders;

wherein said delay means makes a timing at which the new data received by said sense amplifier reaches said latch circuit later than a timing at which the pulse signal reaches said latch circuit.

29. The semiconductor memory circuit according to claim 28, wherein said delay means divides an internal decode output of said column decoder into two signals, one of the two signals being directly supplied to a logic circuit, and another signal being delayed by a delay circuit arranged in said delay means and then supplied to the logic circuit, said logic circuit having a logic output which is the same as the internal decode output of said first column decoder.

30. The semiconductor memory circuit according to claim 29, wherein delay time of said delay circuit of said first column decoder is set in such a manner that a timing of a selecting transistor selected by the internal decode output of said first column decoder is earlier than a timing of a selecting transistor selected by an internal decode output of said second column decoder.

31. A semiconductor memory circuit comprising:

a memory cell array including a plurality of memory cells arranged in rows and columns;

a plurality of column selection lines constituting connection lines extending in a column direction of said memory cell array and divided into a first hierarchy and a second hierarchy;

selecting transistors provided on said column selection lines, said selecting transistors being arranged based on said first hierarchy and said second hierarchy;

a plurality of row selection lines constituting connection lines extending in a row direction of said memory cell array;

a sense amplifier for receiving data from the memory cells through said column selection lines and sensing and amplifying the data;

an address buffer circuit for converting an externally input address signal to an internal address signal;

a row decoder for selecting said row selection lines in response to the internal address signal supplied from said address buffer circuit;

a first column decoder arranged for the first hierarchy and a second column decoder arranged for the second hierarchy, for selecting said column selection lines through said selecting transistors in response to the internal address signal supplied from said address buffer circuit; and delay means provided in said first column decoder, for decreasing a selection speed of said selecting transistors so as to be close to a selection speed of said selecting transistors belonging to said second column decoder.

32. The semiconductor memory circuit according to claim 31, wherein said delay means divides an internal decode output of said first column decoder into two signals, one of the two signals being directly supplied to a logic circuit, and another signal being delayed by a delay circuit arranged in said delay means and then supplied to the logic circuit, said logic circuit having a logic output which is the same as the internal decode output of said first column decoder.

33. The semiconductor memory circuit according to claim 32, wherein delay time of said delay circuit of said first column decoder is set in such a manner that a timing of a selecting transistor selected by the internal decode output of said first column decoder is earlier than a timing of a selecting transistor selected by an internal decode output of said second column decoder.

34. A semiconductor memory circuit comprising:

a memory cell array including a plurality of memory cells arranged in rows and columns;

a plurality of column selection lines constituting connection lines extending in a column direction of said memory cell array and divided into a first hierarchy and a second hierarchy;

selecting transistors provided on said column selection lines, said selecting transistors being arranged based on said first hierarchy and said second hierarchy;

a plurality of row selection lines constituting connection lines extending in a row direction of said memory cell array;

a sense amplifier for receiving data from the memory cells through said column selection lines and sensing and amplifying the data;

an address buffer circuit for convening an externally input address signal to an internal address signal;

a row decoder for selecting said row selection lines in response to the internal address signal supplied from said address buffer circuit;

a first column decoder arranged for the first hierarchy and a second column decoder arranged for the second hierarchy, for selecting said column selection lines through said selecting transistors in response to the internal address signal supplied from said address buffer circuit; and delay means added only to said first column decoder from which a signal is transmitted to said column selection lines at a timing earlier than a normal timing, for changing the timing so as to coincide with the normal timing.

35. The semiconductor memory circuit according to claim 34, wherein said delay means divides an internal decode output of said first column decoder into two signals, one of the two signals being directly supplied to a logic circuit, and another signal being delayed by a delay circuit arranged in said delay means and then supplied to the logic circuit, said logic circuit having a logic output which is the same as the internal decode output of said first column decoder.

36. The semiconductor memory circuit according to claim 35, wherein delay time of said delay circuit of said first column decoder is set in such a manner that a timing of a selecting transistor selected by the internal decode output of said first column decoder is earlier than a timing of a selecting transistor selected by an internal decode output of said second column decoder.

37. A semiconductor memory circuit comprising:

a memory cell array including a plurality of memory cells arranged in rows and columns;

a plurality of column selection lines constituting connection lines extending in a column direction of said memory cell array and divided into a first hierarchy and a second hierarchy; selecting transistors provided on said column selection lines, said selecting transistors being arranged based on said first hierarchy and said second hierarchy;

a plurality of row selection lines constituting connection lines extending in a row direction of said memory cell array;

a sense amplifier for receiving data from the memory cells through said column selection lines and sensing and amplifying the data;

an address buffer circuit for convening an externally input address signal to an internal address signal;

a row decoder for selecting said row selection lines in response to the internal address signal supplied from said address buffer circuit;

a first column decoder arranged for the first hierarchy and a second column decoder arranged for the second hierarchy, for selecting said column selection lines through said selecting transistors in response to the internal address signal supplied from said address buffer circuit; and delay means added to said first column decoder which belongs to a small number of the selecting transistors and transmits a signal to said column selection lines at a very high speed, for decreasing the speed of the signal so as to approach a speed of a signal transmitted to said column selection lines from said second column decoder belonging to a large number of the selecting transistors.

38. The semiconductor memory circuit according to claim 37, wherein said delay means divides an internal decode output of said column decoder into two signals, one of the two signals being directly supplied to a logic circuit, and another signal being delayed by a delay circuit arranged in said delay means and then supplied to the logic circuit, said logic circuit having a logic output which is the same as the internal decode output of said first column decoder.

39. A semiconductor memory circuit comprising:

a memory cell array including a plurality of memory cells arranged in rows and columns;

a plurality of column selection lines constituting connection lines extending in a column direction of said memory cell array and divided into a first hierarchy and a second hierarchy;

selecting transistors provided on said column selection lines, said selecting transistors being arranged based on said first hierarchy and said second hierarchy;

a plurality of row selection lines constituting connection lines extending in a row direction of said memory cell array;

a sense amplifier for receiving data from the memory cells through said column selection lines and sensing and amplifying the data;

an address buffer circuit for converting an externally input address signal to an internal address signal;

a row decoder for selecting said row selection lines in response to the internal address signal supplied from said address buffer circuit;

a first column decoder arranged for the first hierarchy and a second column decoder arranged for the second hierarchy, for selecting said column selection lines through said selecting transistors in response to the internal address signal supplied from said address buffer circuit; and delay means arranged only in said first column decoder, for actively causing a difference in output timing between said first and second column decoders.

40. The semiconductor memory circuit according to claim 39, wherein said delay means divides an internal decode output of said first column decoder into two signals, one of the two signals being directly supplied to a logic circuit, and another signal being delayed by a delay circuit arranged in said delay means and then supplied to the logic circuit, said logic circuit having a logic output which is the same as the internal decode output of said first column decoder.

41. The semiconductor memory circuit occurring to claim 40, wherein delay time of said delay circuit of said first column decoder is set in such a manner that a timing of a selecting transistor selected by the internal decode output of said first column decoder is earlier than a timing of a selecting transistor selected by an internal decode output of said second column decoder.

42. A semiconductor memory circuit comprising:

memory cells arranged at intersections of bit lines and word lines;

a sense amplifier for sensing and amplifying data read out from said memory cells;

data output circuitry for outputting data supplied from said sense amplifier;

selecting transistors connected between said bit lines and said sense amplifier so as to define a bit line hierarchy comprising a plurality of stages;

an address buffer circuit for converting an externally input address signal to an internal address signal;

a column decoder including column decoder portions each associated with a corresponding one of the stages of said bit line hierarchy, for selecting said bit lines through said selecting transistors in response to the internal address signal supplied from said address buffer circuit; and delay means selectively provided for the column decoder portions associated with the stages of said bit line hierarchy, for decreasing a selection speed of said selecting transistors associated with at least an upper stage of said bit line hierarchy, a first column decoder portion having said delay means and a second column decoder portion not having said delay means.

43. The semiconductor memory circuit according to claim 42, wherein said data output circuitry further comprises:

means for detecting a transition of the internal address signal and generating a pulse signal;

latch circuitry for receiving data supplied from said sense amplifier and holding the data responsive to the pulse signal;

means for preventing said latch circuit from outputting the data supplied from said sense amplifier in response to the pulse signal for a period of time from when the externally input address signal is converted to the internal address signal until new data is sensed and amplified by said sense amplifier; and wherein said delay means delays when the new data received by said sense amplifier is forwarded to said latch circuitry to a time subsequent to when the pulse signal is generated by said detecting means.

44. The semiconductor memory circuit according to claim 42, wherein said delay means divides an internal decode output of said first column decoder portion into two signals, a first signal being directly supplied to a logic circuit, and a second signal being delayed by a delay circuit arranged in said delay means and then supplied to the logic circuit, the logic circuit having a logic output which is the same as the internal decode output of said first column decoder portion.

45. The semiconductor memory circuit according to claim 44, wherein a delay time of said delay circuit of said first column decoder portion associated with an upper stage of said bit line hierarchy is longer than a delay time of a delay circuit of a third column decoder portion associated with a lower stage of said bit line hierarchy, and a delay time of a delay circuit of a fourth column decoder portion associated with an uppermost stage of the bit line hierarchy is set such that an internal decode output of said fourth column decoder portion is output prior to an internal decode output of said second column decoder portion, said second column decoder portion associated with a lowest stage of said bit line hierarchy.

46. The semiconductor memory circuit according to claim 45, wherein delay times of delay circuits arranged in column decoder portions associated with adjacent stages of said bit line hierarchy in a common row are set equal to each other.

47. A semiconductor memory circuit comprising:

memory cells arranged at intersections of bit lines and word lines;

a sense amplifier for sensing and amplifying data read out from said memory cells;

data output circuitry for outputting data supplied from said sense amplifier;

selecting transistors connected between said bit lines and said sense amplifier so as to define a bit line hierarchy comprising a plurality of stages;

an address buffer circuit for converting an externally input address signal to an internal address signal;

a column decoder including column decoder portions each associated with a corresponding one of the stages of said bit line hierarchy, for selecting said bit lines through said selecting transistors in response to the internal address signal supplied from said address buffer circuit; and delay means selectively included in said column decoder portions from which a signal is transmitted to said bit lines at a first time earlier than a second time, for changing the first time to coincide with the second time, a first column decoder portion having said delay means and a second column decoder portion not having said delay means.

48. The semiconductor memory circuit according to claim 47, wherein said data output circuitry further comprises:

means for detecting a transition of the internal address signal and generating a pulse signal;

latch circuitry for receiving data supplied from said sense amplifier and holding the data responsive to the pulse signal;

means for preventing said latch circuit from outputting the data supplied from said sense amplifier in response to the pulse signal for a period of time from when the externally input address signal is converted to the internal address signal until new data is sensed and amplified by said sense amplifier; and wherein said delay means delays when the new data received by said sense amplifier is forwarded to said latch circuitry to a time subsequent to when the pulse signal is generated by said detecting means.

49. The semiconductor memory circuit according to claim 47, wherein said delay means divides an internal decode output of said first column decoder portion into two signals, a first signal being directly supplied to a logic circuit, and a second signal being delayed by a delay circuit arranged in said delay means and then supplied to the logic circuit, the logic circuit having a logic output which is the same as the internal decode output of said first column decoder portion.

50. The semiconductor memory circuit according to claim 49, wherein a delay time of said delay circuit of said first column decoder portion associated with an upper stage of said bit line hierarchy is longer than a delay time of a delay circuit of a third column decoder portion associated with a lower stage of said bit line hierarchy, and a delay time of a delay circuit of a fourth column decoder portion associated with an uppermost stage of the bit line hierarchy is set such that an internal decode output of said fourth column decoder portion is output prior to an internal decode output of said second column decoder portion, said second column decoder portion associated with a lowest stage of said bit line hierarchy.

51. The semiconductor memory circuit according to claim 50, wherein delay times of delay circuits arranged in column decoder portions associated with adjacent stages of said bit line hierarchy in a common row are set equal to each other.

52. A semiconductor memory circuit comprising:

memory cells arranged at intersections of bit lines and word lines;

a sense amplifier for sensing and amplifying data read out from said memory cells;

data output circuitry for outputting data supplied from said sense amplifier;

selecting transistors connected between said bit lines and said sense amplifier so as to define a bit line hierarchy comprising a plurality of stages;

an address buffer circuit for converting an externally input address signal to an internal address signal;

a column decoder including column decoder portions each associated with a corresponding one of the stages of said bit line hierarchy, for selecting said bit lines through said selecting transistors in response to the internal address signal supplied from said address buffer circuit; and delay means, included in a first column decoder portion of an upper stage of said bit line hierarchy associated with a first number of said selecting transistors which transmits a signal to said bit lines at a very high speed, for decreasing the speed of the signal to approach a speed of a signal transmitted to said bit lines from a second column decoder portion of a lower stage of said bit line hierarchy associated with a second number of said selecting transistors larger than the first number.

53. The semiconductor memory circuit according to claim 52, wherein said data output circuitry further comprises:

means for detecting a transition of the internal address signal and generating a pulse signal;

latch circuitry for receiving data supplied from said sense amplifier and holding the data responsive to the pulse signal;

means for preventing said latch circuit from outputting the data supplied from said sense amplifier in response to the pulse signal for a period of time from when the externally input address signal is converted to the internal address signal until new data is sensed and amplified by said sense amplifier; and wherein said delay means delays when the new data received by said sense amplifier is forwarded to said latch circuitry to a time subsequent to when the pulse signal is generated by said detecting means.

54. The semiconductor memory circuit according to claim 52, wherein said delay means divides an internal decode output of said first column decoder portion into two signals, a first signal being directly supplied to a logic circuit, and a second signal being delayed by a delay circuit arranged in said delay means and then supplied to the logic circuit, the logic circuit having a logic output which is the same as the internal decode output of said first column decoder portion.

55. The semiconductor memory circuit according to claim 54, wherein a delay time of said delay circuit of said first column decoder portion associated with an upper stage of said bit line hierarchy is longer than a delay time of a delay circuit of a third column decoder portion associated with a lower stage of said bit line hierarchy, and a delay time of a delay circuit of a fourth column decoder portion associated with an uppermost stage of the bit line hierarchy is set such that an internal decode output of said fourth column decoder portion is output prior to an internal decode output of said second column decoder portion, said second column decoder portion associated with a lowest stage of said bit line hierarchy.

56. A semiconductor memory circuit comprising:

memory cells arranged at intersections of bit lines and word lines;

a sense amplifier for sensing and amplifying data read out from said memory cells;

data output circuitry for outputting data supplied from said sense amplifier;

selecting transistors connected between said bit lines and said sense amplifier so as to define a bit line hierarchy comprising a plurality of stages;

an address buffer circuit for converting an externally input address signal to an internal address signal;

a column decoder including column decoder portions each associated with a corresponding one of the stages of said bit line hierarchy, for selecting said bit lines through said selecting transistors in response to the internal address signal supplied from said address buffer circuit; and delay means arranged only in a first column decoder portion, for actively causing a difference in output timing between said column decoder portions.

57. The semiconductor memory circuit according to claim 56, wherein said data output circuitry further comprises:

means for detecting a transition of the internal address signal and generating a pulse signal;

latch circuitry for receiving data supplied from said sense amplifier and holding the data responsive to the pulse signal;

means for preventing said latch circuit from outputting the data supplied from said sense amplifier in response to the pulse signal for a period of time from when the externally input address signal is converted to the internal address signal until new data is sensed and amplified by said sense amplifier; and wherein said delay means delays when the new data received by said sense amplifier is forwarded to said latch circuitry to a time subsequent to when the pulse signal is generated by said detecting means.

58. The semiconductor memory circuit according to claim 56, wherein said delay means divides an internal decode output of said first column decoder portion into two signals, a first signal being directly supplied to a logic circuit, and a second signal being delayed by a delay circuit arranged in said delay means and then supplied to the logic circuit, the logic circuit having a logic output which is the same as the internal decode output of said first column decoder portion.

59. The semiconductor memory circuit according to claim 58, wherein a delay time of said delay circuit of said first column decoder portion associated with an upper stage of said bit line hierarchy is longer than a delay time of a delay circuit of a third column decoder portion associated with a lower stage of said bit line hierarchy, and a delay time of a delay circuit of a fourth column decoder portion associated with an uppermost stage of the bit line hierarchy is set such that an internal decode output of said fourth column decoder portion is output prior to an internal decode output of a second column decoder portion, said second column decoder portion associated with a lowest stage of said bit line hierarchy.

60. The semiconductor memory circuit according to claim 59, wherein delay times of delay circuits arranged in column decoder portions associated with adjacent stages of said bit line hierarchy in a common row are set equal to each other.

61. A semiconductor memory device comprising:

memory cells arranged at intersections of bit lines and word lines;

a sense amplifier for sensing and amplifying data read out from said memory cells;

data output circuitry for outputting data supplied-from said sense amplifier;

selecting transistors connected between said bit lines and said sense amplifier so as to define a bit line hierarchy comprising a plurality of stages; and a column decoder for decoding column addresses to generate bit line selecting signals supplied to said selecting transistors for selecting said bit lines, said column decoder including column decoder portions each respectively associated with a corresponding one of the stages of said bit line hierarchy, wherein a first column decoder portion associated with a first stage of said bit line hierarchy includes delay means for delaying the supplying of selecting signals to first ones of said selecting transistors relative to the supplying of selecting signals to second ones of said selecting transistors by a second column decoder portion.

\* \* \* \* \*